(12) United States Patent
Wang et al.

(10) Patent No.: US 6,396,862 B1
(45) Date of Patent: May 28, 2002

(54) LED WITH SPREADING LAYER

(75) Inventors: Wang Nang Wang, Bath (GB);
Stephen Sen-Tien Lee, Taipei (TW)

(73) Assignee: Arima Optoelectronics, Corporation, Taipei (TW)

( * ) Notice: Subject to any disclaimer, the term of this patent is extended or adjusted under 35 U.S.C. 154(b) by 0 days.

(21) Appl. No.: 09/453,980

(22) Filed: Dec. 2, 1999

(30) Foreign Application Priority Data

Dec. 2, 1998 (GB) ............................................. 9826514

(51) Int. Cl.$^7$ ............................. H01S 5/00; H01L 33/00
(52) U.S. Cl. ............................ 372/46; 372/45; 257/79; 257/94; 257/103
(58) Field of Search ............................ 372/45, 46, 96; 257/13–15, 22, 79, 94, 103, 201

(56) References Cited

U.S. PATENT DOCUMENTS

| | | | | |
|---|---|---|---|---|
| 5,048,035 A | * | 9/1991 | Sugawara et al. | 372/45 |
| 5,164,798 A | * | 11/1992 | Huang | 257/97 |
| 5,428,634 A | | 6/1995 | Bryan et al. | 372/45 |
| 5,466,950 A | | 11/1995 | Sugawara et al. | 257/94 |
| 5,565,694 A | | 10/1996 | Huang et al. | 257/97 |
| 5,568,499 A | | 10/1996 | Lear | 372/45 |
| 5,600,158 A | * | 2/1997 | Noto et al. | 257/94 |
| 5,675,605 A | | 10/1997 | Fujii | 372/96 |
| RE35,665 E | * | 11/1997 | Lin et al. | 257/94 |
| 5,706,306 A | | 1/1998 | Jiang et al. | 372/96 |
| 5,814,838 A | * | 9/1998 | Ohtsuka et al. | 257/94 |
| 6,057,562 A | * | 5/2000 | Lee et al. | 257/96 |

FOREIGN PATENT DOCUMENTS

| | | |
|---|---|---|
| EP | 0368578 | 5/1990 |
| EP | 0 373 933 | 6/1990 |

OTHER PUBLICATIONS

Search Report relating to United Kingdom application No. GB 9826510.1, dated Mar. 11, 1999, 2 pp.
Search Report relating United Kingdom application No. GB 98265143, dated Mar. 11, 1999, 2 pp.

* cited by examiner

*Primary Examiner*—Paul Ip
*Assistant Examiner*—James Menefee
(74) *Attorney, Agent, or Firm*—Christie, Parker & Hale, LLP

(57) ABSTRACT

A semiconductor device has a window layer (8), a current spreading layer (7) below the window layer and a cladding layer (6) below the current spreading layer. The band gap energy of the spreading layer is higher than that of the window layer and lower than that of the cladding layer and the carrier concentration of the spreading layer is lower than that of the window layer and higher than that of the cladding layer.

11 Claims, 1 Drawing Sheet

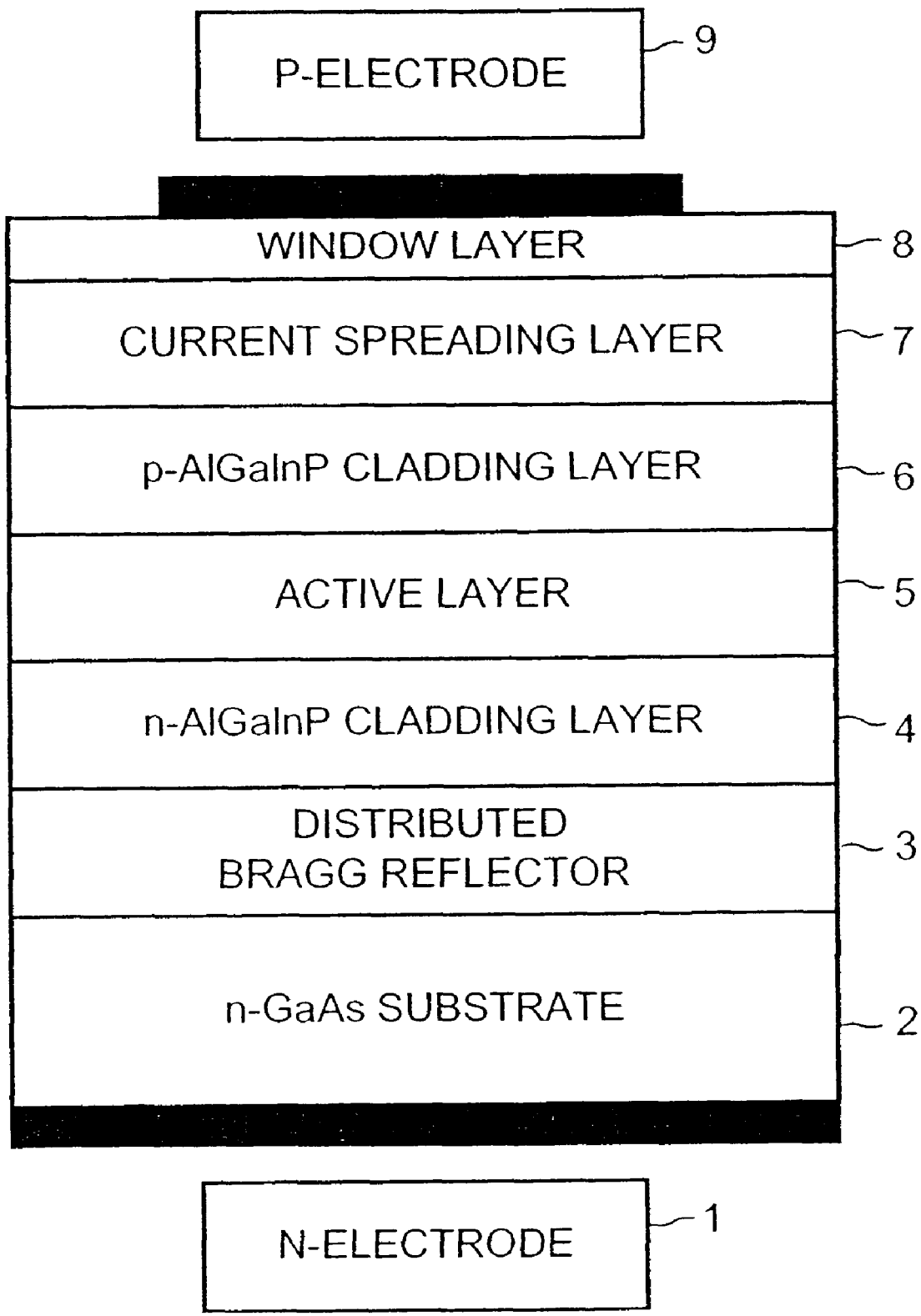

LED WITH SPREADING LAYER

The present invention relates to semiconductor devices, more particularly light-emitting diodes (LEDs) and laser diodes (LDs).

According to the present invention there is provided a semiconductor device having a window layer, a current spreading layer below the window layer and a cladding layer below the current spreading layer, wherein the band gap energy of the spreading layer is higher than that of the window layer and lower than that of the cladding layer and the carrier concentration of the spreading layer is lower than that of the window layer and higher than that of the cladding layer.

The present invention will now be described, by way of example, with reference to the accompanying drawing, which is a section through an example of an LED according to the invention.

Referring to the drawing, a light-emitting diode comprises: an ohmic n-electrode 1 on a rear surface of a GaAs substrate 2; a distributed AlGaAs Bragg reflector layer 3 grown on the substrate 2 (in the form of a multi layer lamination) to improve luminous efficiency; a first, lower AlGaInP cladding layer 4 grown on the layer 3; an active layer 5 (which could be a double hetero-junction layer or a multi-quantum well layer) grown on the layer 4; a second, upper AlGaInP cladding layer 6 grown on the layer 5; an AlGaInP current spreading layer 7 grown on the layer 6; a GaInP window layer 8 grown on the layer 7; and an ohmic p-electrode 9 on the window layer 8.

The band gap energy of spreading layer 7 is higher than that of the window 4 layer 8 and lower than that of the upper cladding layer 6 and the carrier concentration of the spreading layer 7 is lower than that of the window layer 8 and higher than that of the upper cladding layer 6. From the upper cladding layer 6 to spreading layer 7 one can use a linear composition gradient, a parabolic composition gradient or a staged composition gradient layer to alleviate lattice mismatching. From the spreading layer 7 to window layer 8, one can use a linear composition gradient, a parabolic composition gradient or a staged composition gradient via a transfer layer to transfer band gap energy smoothly from the higher band gap spreading layer to the lower band gap window layer.

Compositions of a typical example are set out below.

1. Distributed Bragg reflector layer 3

$Al_xGa_{1-x}As/Al_yGa_{1-y}As$ where $0 \leq x \leq 1$; $0 \leq y \leq 1$; $x \neq y$ 2. Cladding layers 4 and 6

$(Al_xGa_{1-x})_{1-y}In_yP$ where $0.5 \leq x \leq 1$; $0.4 \leq y \leq 0.6$
Thickness $0.5 \ \mu m \leq D \leq 1.5 \ \mu m$ 3. Current spreading layer 7

$(Al_xGa_{1-x})_{1-y}In_yP$ where $0 \leq x \leq 0.5$; $0 \leq y \leq 0.2$
Thickness $0 \leq D \leq 1 \ \mu m$ 4. The transfer layer $(Al_xGa_{1-x})_yIn_{1-y}P$ where $0 \leq x \leq 1$; $0.4 \leq y \leq 0.6$ using a linear composition gradient, a parabolic composition gradient or a staged composition gradient.

5. Multi-quantum well $(Al_{x1}Ga_{1-x1})_{1-y1}In_{y1}P/(Al_{x2}Ga_{1-x2})_{1-y2}In_{y2}P$ Thickness $D \leq 20$ nm
where $0.5 \leq x1 \leq 1$; $0.4 \leq y1 \leq 0.6/0 \leq x2 \leq 0.4$; $0 \leq y2 \leq 0.4$ 6. Window layer 8

$Ga_xIn_{1-x}P$ where $0.9 \leq x \leq 1$
Thickness $5 \ \mu m \leq D \leq 15 \ \mu m$

What is claimed is:

1. A semiconductor light-emitting device having a window layer, a current spreading layer below the window layer and a cladding layer below the current spreading layer, wherein the band gap energy of the spreading layer is higher than that of the window layer and lower than that of the cladding layer, the carrier concentration of the spreading layer is lower than that of the window layer and higher than that of the cladding layer, and the spreading layer has the composition:

$(Al_xGa_{1-x})_{1-y}In_yP$ where $0 < x \leq 0.5$; $0 < y \leq 0.2$.

2. A device according to claim 1, wherein the cladding layer has the composition:

$(Al_xGa_{1-x})_{1-y}In_yP$ where $0.5 \leq x \leq 1$; $0.4 \leq y \leq 0.6$.

3. A device according to claim 1, wherein the window layer has the composition:

$Ga_xIn_{1-x}P$.

4. A device according to claim 1, wherein from the cladding layer to the spreading layer there is a composition gradient.

5. A device according to claim 1, wherein from the spreading layer to the window layer there is a composition gradient.

6. A device according to claim 1, wherein there is an active layer below the cladding layer.

7. A device according to claim 6, wherein the active layer is a multi-quantum well.

8. A device according to claim 7, wherein the multi-quantum well has the composition:

$(Al_{x1}Ga_{1-x1})_{1-y1}In_{y1}P/(Al_{x2}Ga_{1-x2})_{1-y2}In_{y2}P$ where $0.5 \leq x1 \leq 1$; $0.4 \leq y1 \leq 0.6/0 \leq x2 \leq 0.4$; $0 \leq y2 \leq 0.4$.

9. A device according to claim 6, wherein there is a further cladding layer below the active layer.

10. A device according to claim 9, wherein there is a distributed Bragg reflector layer below the further cladding layer.

11. A device according to claim 10, wherein the Bragg reflector layer has the composition:

$Al_xGa_{1-x}As/Al_yGa_{1-y}As$ where $0 \leq x \leq 1$; $0 \leq y \leq 1$; $x \neq y$.

* * * * *